United States Patent [19]

Kitaoka et al.

[11] Patent Number: 5,586,159
[45] Date of Patent: Dec. 17, 1996

[54] SUBSTRATE HOLDING SYSTEM AND EXPOSURE APPARATUS HAVING THE SAME

[75] Inventors: Atsushi Kitaoka, Kisarazu; Mitsutoshi Kuno; Mitsuji Marumo, both of Sagamihara, all of Japan

[73] Assignee: Canon Kabushiki Kaisha, Tokyo, Japan

[21] Appl. No.: 411,966

[22] Filed: Mar. 28, 1995

[30] Foreign Application Priority Data

Mar. 28, 1994 [JP] Japan ................................ 6-056492

[51] Int. Cl.⁶ ................................................ H01L 21/68
[52] U.S. Cl. ................................................ 378/34; 269/21
[58] Field of Search ............................ 378/34, 35, 208; 269/21, 20; 250/492.1, 492.2, 492.3, 491.1

[56] References Cited

U.S. PATENT DOCUMENTS

| | | | |
|---|---|---|---|
| 4,391,511 | 7/1983 | Akiyama et al. | 269/21 X |
| 5,160,961 | 11/1992 | Marumo et al. | 355/53 |
| 5,161,177 | 11/1992 | Chiba | 378/34 |
| 5,191,218 | 3/1993 | Mori et al. | 250/453.11 |
| 5,197,089 | 3/1993 | Baker | 378/34 |
| 5,203,547 | 4/1993 | Marumo | 269/21 |
| 5,226,523 | 7/1993 | Kawakami et al. | 198/341 |
| 5,231,291 | 7/1993 | Amemiya et al. | 250/443.1 |
| 5,329,126 | 7/1994 | Amemiya et al. | 378/34 |
| 5,417,408 | 5/1995 | Ueda | 269/21 |

FOREIGN PATENT DOCUMENTS

| | | | |
|---|---|---|---|
| 2-81457 | 3/1990 | Japan . | |
| 4176533 | 6/1992 | Japan | 269/21 |
| 4-199655 | 7/1992 | Japan . | |

*Primary Examiner*—David P. Porta
*Attorney, Agent, or Firm*—Fitzpatrick, Cella Harper & Scinto

[57] ABSTRACT

A substrate holding system includes a holding mechanism for holding a substrate through vacuum attraction, a vacuum evacuating device for supplying a vacuum to the holding mechanism, a first voltage source for supplying electric power to the vacuum evacuating device, a second voltage source, separate from the first voltage source, for supplying electric power to the vacuum evacuating device, and a controller for energizing the vacuum evacuating device at a higher evacuation capacity level, when the first voltage source is in operable order, and for energizing the vacuum evacuating device at a lower evacuation capacity level, when the second voltage source supplies electric power to the vacuum evacuating device, and the first voltage source is not in operable order.

15 Claims, 3 Drawing Sheets

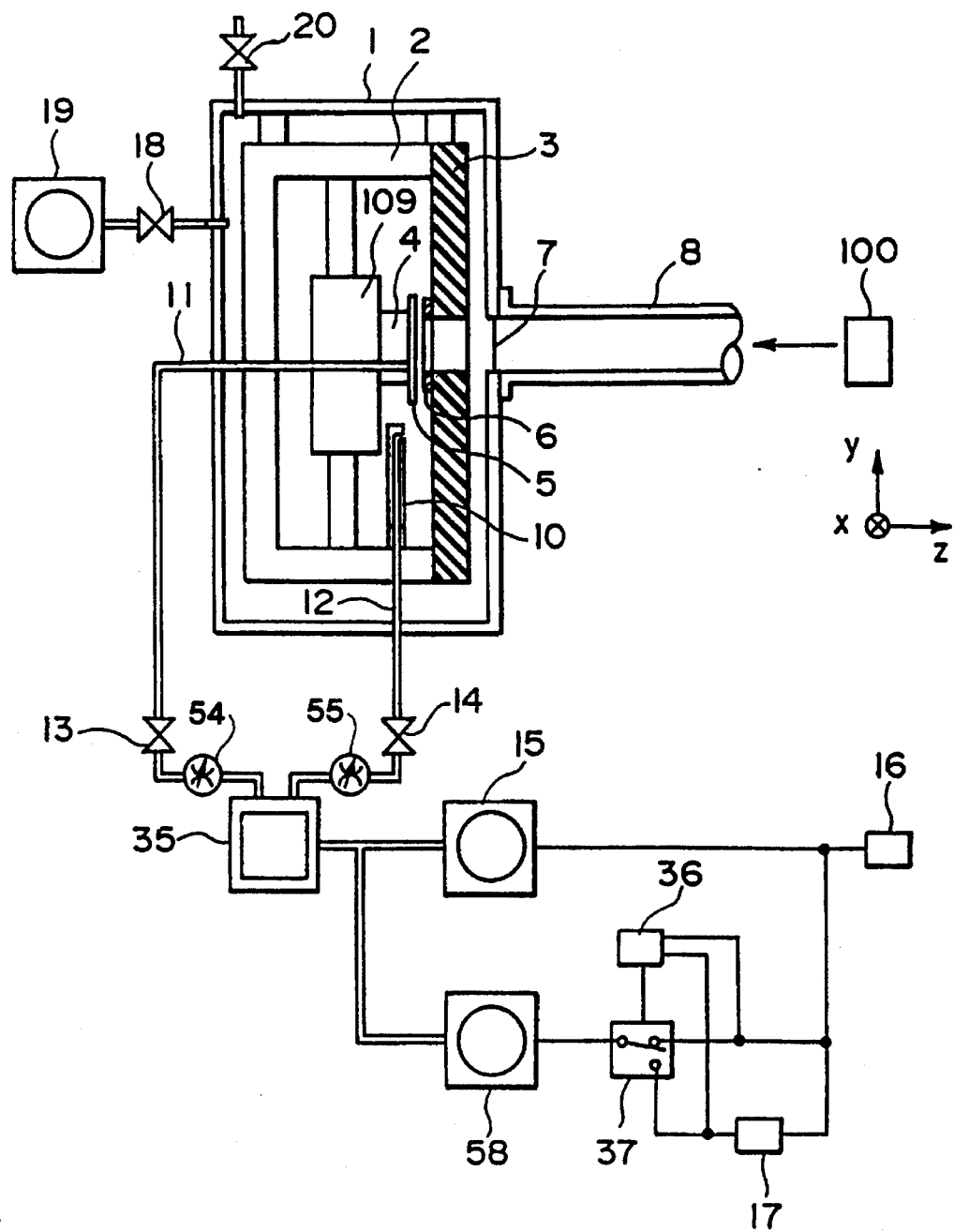
F I G. 1

SUBSTRATE HOLDING SYSTEM AND EXPOSURE APPARATUS HAVING THE SAME

FIELD OF THE INVENTION AND RELATED ART

This invention relates generally to an exposure apparatus for use the manufacture of semiconductor devices, for example. More particularly, the invention is concerned with a vacuum holding system in such exposure apparatus, for attracting and holding a substrate such as a mask or a wafer through vacuum attraction.

As a vacuum holding system for attracting and holding a mask or a wafer through vacuum attraction, there is a vacuum holding system for use in an X-ray exposure apparatus as disclosed in Japanese Laid-Open Patent Application, Laid-Open No. 81457/1990.

FIG. 3 is a schematic view of the structure of the holding system in an X-ray exposure apparatus, as disclosed in the aforementioned document.

The holding system in the X-ray exposure apparatus shown in FIG. 3 is arranged to assuredly attract and hold an article to be held, and also to continuously attract the article even during electric power failure. It has a structure such as described below.

Stage accommodating chamber 101 is coupled to a light source, not shown, through a barrel 108. Disposed at the connection between the stage accommodating chamber 101 and the barrel 108 is a blocking window 107 made of beryllium (Be), and X-rays emitted by the unshown light source pass through this blocking window 107 and enter the stage accommodating chamber 101.

Connected to the stage accommodating chamber 101 are a vacuum pump 119 and a helium (He) source (not shown), through valves 118 and 120, respectively. By means of these elements, the air within the stage accommodating chamber 101 can be replaced by helium gas.

Mask 106 and wafer 105, which are members to be irradiated with X-rays, are held by a mask chuck 103 and a wafer chuck 104, respectively. The wafer chuck 104 is fixed to a wafer stage 109. These components are all gas-tightly accommodated within the stage accommodating chamber.

The stage accommodating chamber 101 is further provided with a wafer hand 110 for transferring a wafer 105 thereinto or therefrom from or to a load lock chamber, not shown in the drawing. The mask 106 is mechanically held by the mask chuck 103. The attraction of a wafer by the wafer chuck 104 and by the wafer hand 110 is provided by a vacuum attraction force, and this vacuum attraction force is produced by a hydraulic rotation pump 115 disposed outside the chamber and being communicated thereto through flow-through pipings 111 and 112.

The pipings 111 and 112 are provided with valves 113 and 114 as well as an accumulator chamber 135. Also, to the hydraulic rotation pump 115, a normal power source 116 and an emergency power source 117 for preparation of a power failure, are connected through a voltage source changing switch 137. Upon power failure, the source changing switch 137 changes the voltage source for electric power supply to the hydraulic rotation pump 115, from the normal power source 116 to the emergency power source 117.

The voltage source interchanging switch 137 is provided with a voltage detecting circuit 136. The power failure is detected by this voltage detecting circuit 136 and, in response thereto, the above-described switching operation is made.

Now, the operation of the holding system in the X-ray exposure apparatus of the structure described above will be explained.

First, the stage accommodating chamber is at an atmospheric pressure. In this state, a mask 106 is mechanically held by the mask chuck 103. Then, the valve 118 is opened and, by using the vacuum pump 119, the inside pressure of the stage accommodating chamber 101 is reduced to a predetermined pressure (e.g., $10^{-3}$ Torr). Subsequently, the valve 118 is closed and the valve 120 is opened, such that helium is supplied until the inside pressure of the stage accommodating chamber 101 reaches a predetermined pressure (e.g., 100 Torr).

As the helium is supplied and the inside pressure of the stage accommodating chamber 101 reaches the predetermined pressure, the wafer hand 110 conveys a wafer 105 onto the wafer chuck 104. The wafer 105 is held fixed by the wafer chuck 104 through vacuum attraction. The vacuum attraction at the wafer chuck 104 and at the wafer hand 110 is provided by the hydraulic rotation pump 115 through the valves 113 and 114. Here, the wafer 105 is held by the wafer hand 110 vertically (upstanding position).

The accomplished pressure of the hydraulic rotation pump 115 is $10^{-2}$ Torr or lower and, if the inside pressure of the stage accommodating chamber 101 is 100 Torr, an attraction force of 0.13 Kg/cm$^2$ is attainable. As a result, the wafer 105 is assuredly attracted and held by it.

If power failure occurs in operation of the holding system described above, the occurrence of power failure is detected by the voltage detecting circuit 136. As the occurrence of power failure is detected, the switch 137 changes the electric power supply to the hydraulic pump 115, from the normal voltage source 116 to the emergency power source 117. In response, the electric power supply to the hydraulic pump 115 is made from the emergency power source 117, without interruption by the power failure. As a result, the wafer chuck 104 keeps the vacuum attraction force the same as before the power failure, and the wafer 105 is continuously held fixed by the wafer chuck, without being dropped.

Usually, the above-described X-ray exposure apparatus is placed in a clean room. In that case, an urgency power supply unit (UPS unit) to be used for a holding system of the X-ray exposure apparatus is desirably disposed within the clean room, for ease of manipulation. If, however, the UPS unit is disposed within the clean room, the size of the UPS unit is limited due to the limitation of the floor area of the clean room.

In the holding system described above, vacuum attraction at each attracting means is provided by a single common pump. This pump should have a vacuum evacuation capacity sufficient to produce a vacuum attraction force capable of preventing a drop or slip of a wafer or of assuring correct transfer of a wafer between chucks. Thus, a large capacity pump has been used. This means that use of a large capacity backup power source is necessary during the power failure, while taking into account the load capacity of that pump. Consequently, conventional holding systems use large UPS units. Large size UPS units raise a problem because of a limitation in using it within a clean room. Also, the necessity of a backup power source of a large capacity undesirably increases the cost.

SUMMARY OF THE INVENTION

It is accordingly an object of the present invention to provide an improved substrate holding system by which at least one of the above-described problems is solved.

It is another object of the present invention to provide a substrate holding system by which the capacity of a backup power source to be used in power failure is made smaller.

It is a further object of the present invention to provide a substrate holding system by which the cost thereof is made lower.

It is a still further object of the present invention to provide an exposure apparatus having an improved substrate holding system.

In accordance with an aspect of the present invention, there is provided a substrate holding system, comprising: a holding mechanism for holding a substrate through vacuum attraction; vacuum evacuating means for supplying a vacuum to said holding mechanism; a first voltage source for supplying electric power to said vacuum evacuating means; a second voltage source separate from said first voltage source; and a controller for energizing said vacuum evacuating means at a higher evacuation capacity level, when said first voltage source is in operable order, and for energizing said vacuum evacuating means at a lower evacuation capacity level, when said second voltage source applies voltage to the vacuum evacuating means and said first voltage source is not in operable order.

The second voltage source may serve as a backup voltage.

The vacuum evacuating means may comprise first and second pumps.

The controller may energize said first and second pumps with said first voltage source when said first voltage source in operable order, and energize only said second pump with said second voltage source said when first voltage source is not in operable order.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic view of the structure of a substrate holding system according to an embodiment of the present invention.

DESCRIPTION OF THE PREFERRED EMBODIMENTS

Figure 2:
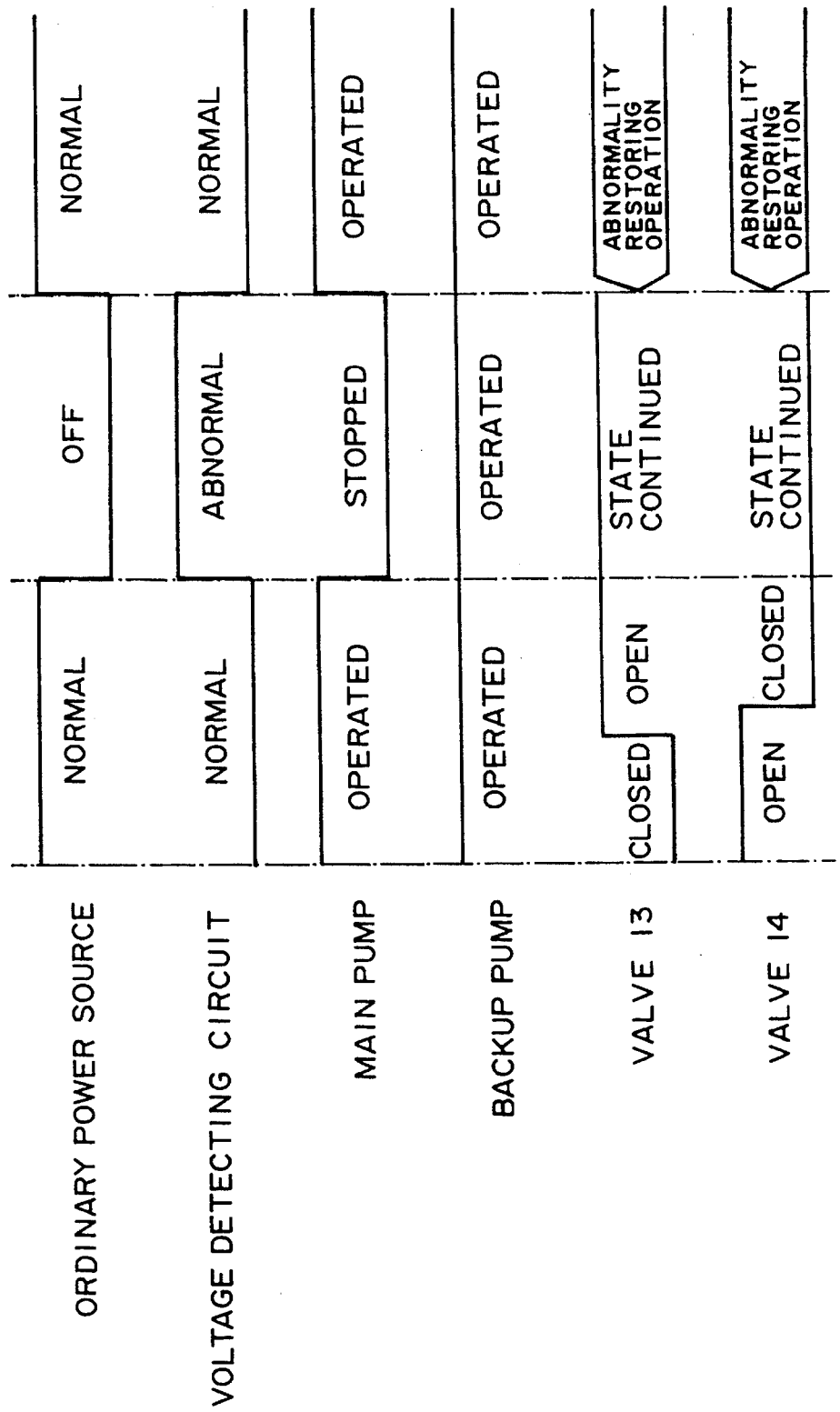
FIG. 2 is a sequence chart for explaining the operational sequence of the substrate holding system of the FIG. 1 embodiment.
Figure 3:
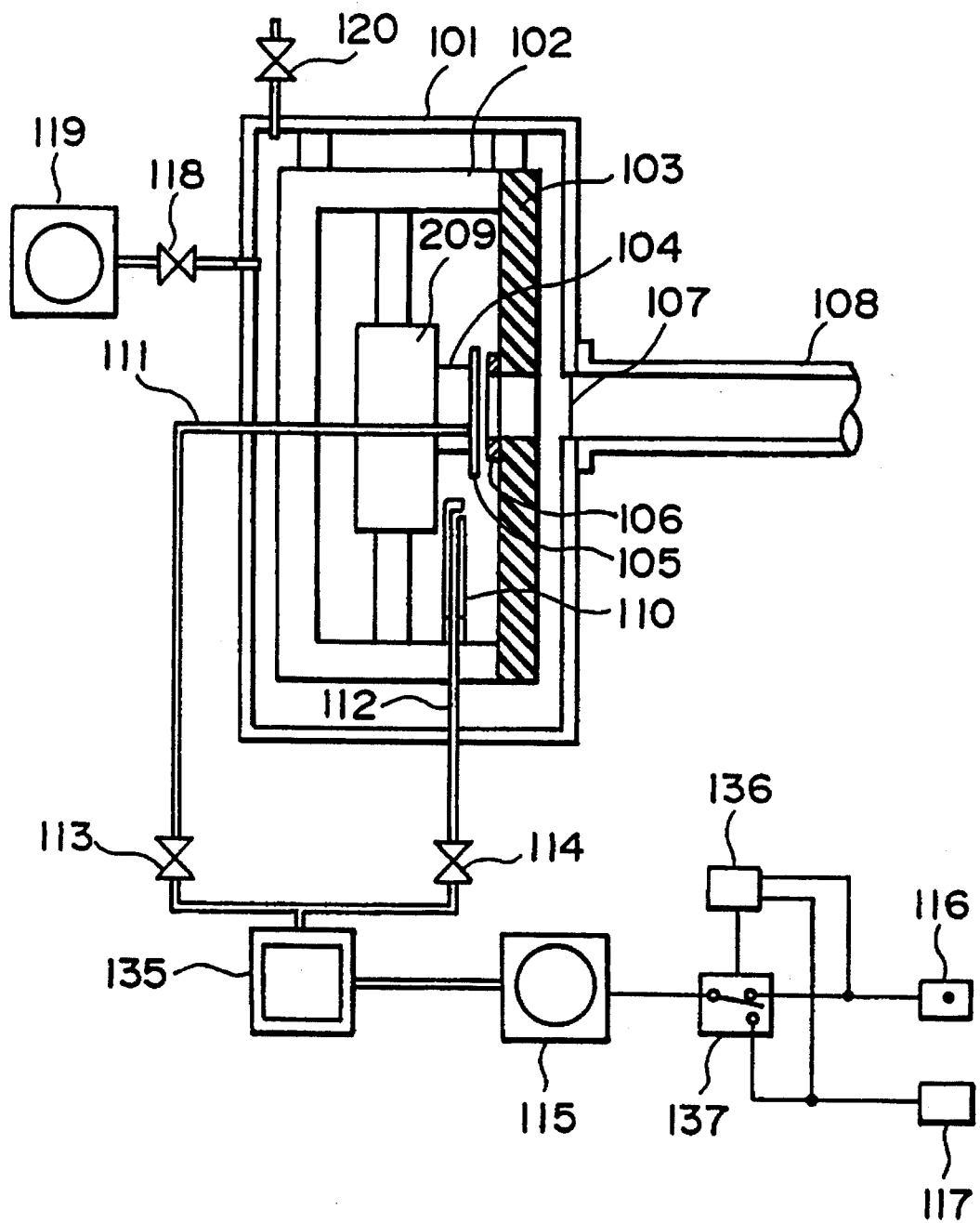
FIG. 3 is a schematic view of the structure of a known type substrate holding system.

A preferred embodiment of the present invention will be explained below, in conjunction with the drawings.

FIG. 1 is a schematic view of the structure of a substrate holding system according to an embodiment of the present invention.

The holding system of this embodiment is to be used in an X-ray exposure apparatus, and it is arranged so that an article to be held is assuredly attracted and held through vacuum attraction and, upon power failure, a backup voltage source is used to continue the attraction to prevent dropping the article. The structure thereof will be explained below in detail.

Stage accommodating chamber 1 is coupled to an X-ray light source 100 such as a synchrotron radiation source, for example, through a barrel 8. Disposed at the connection between the stage accommodating chamber 1 and the barrel 8 is a blocking window 7 made of beryllium (Be), and X-rays emitted by the X-ray light source 100 pass through this blocking window 7 and enter the stage accommodating chamber 1.

Connected to the stage accommodating chamber 1 are a vacuum pump 19 and a helium (He) source (not shown), through valves 18 and 20, respectively. By means of these elements, the air within the stage accommodating chamber 1 can be replaced by helium (He) gas.

Mask 6 and wafer 5, which are members to be irradiated with X-rays, are held by a mask chuck 3 and a wafer chuck 4, respectively. These components are all gas-tightly accommodated within the stage accommodating chamber 1. The stage accommodating chamber 1 is further provided with a wafer hand 10 for transferring a wafer 5 thereinto or therefrom from or to a load lock chamber, not shown in the drawing.

In the holding system described above, the mask 6 is mechanically held by the mask chuck 3. The attraction of a wafer by the wafer chuck 4 and by the wafer hand 10 is all provided by vacuum attraction force, and this vacuum attraction force is produced by a primary pump 15 and a secondary (backup) pump 58 disposed outside the chamber and being communicated thereto through flow-through pipings 11 and 12.

The pipings 11 and 12 are provided with valves 13 and 14 as well as restriction valves 54 and 55, respectively. The valves 13 and 14 each serves to open and close the corresponding piping, and the restriction valves 54 and 55 each serves to slow the change in pressure within the corresponding piping. The restriction valves 54 and 55 each may be the one disclosed in Japanese Laid-Open Patent Application, Laid-Open No. 199655/1992. The pipings 11 and 12 are connected to the primary pump 15 and the backup pump 58 through an accumulator chamber 35.

A normal power source 16 such as a commercial voltage source is connected to the primary pump 15. Also, this normal power source 16 as well as an emergency power source (backup power source) 17 are connected to the backup pump 58 through a voltage switch 37. The emergency power source 17 may comprise an urgency power supply unit (UPS unit) such as a storage battery. The voltage switch 37 serves to change the voltage supply line to the backup pump 58 upon a power failure, from the normal voltage source 16 to the emergency voltage source 17. The voltage switch 37 is provided with a voltage detecting circuit (monitoring means) 36 which serves to detect a possible power failure. Details of the electric system are as follows.

One of the input terminals of the switching circuit 37 is connected to the output line of the normal power source 16, and the other input terminal thereof is connected to the output line of the emergency power source 17. The output terminal is connected to the input line of the backup pump 58. The voltage detecting circuit 36 is connected to the output lines of both the normal power source 16 and the emergency power source 17, so that it serves to detect voltages at theses output lines. Also, it serves to control the switching operation of the switching circuit 37 on the basis of the voltage detection.

In this embodiment, in a normal or an ordinary state, vacuum attraction at respective attracting means is performed by means of the primary pump 15 and the backup pump 58. Upon power failure, only the backup pump 58 is used to perform vacuum attraction at a predetermined attracting means (only the attracting means attracting a wafer at the time of the power failure).

In the X-ray exposure apparatus in which the holding system described above is used, the power source backup is provided only to such portion in which damage to a structure or a drop of an article being held occurs unless the power backup is not provided. No power source backup is performed with regard to the remaining portion. Namely, since in the occurrence of a power failure it is sufficient that the state of the apparatus at the time of the power failure is kept until the power supply is restored, the voltage supply to the components is minimized.

In consideration of the power failure, in the present embodiment, the backup pump 58 has a small vacuum evacuation capacity as compared with that of the primary pump 15 (e.g., a fraction of the capacity of the primary pump).

Now, the operation of the holding system of the X-ray exposure apparatus, of the structure described above, will be explained.

First, the stage accommodating chamber 1 is at an atmospheric pressure. In this state, a mask 6 is mechanically held by the mask chuck 3. Then, the valve 18 is opened and, by using the vacuum pump 19, the inside pressure of the stage accommodating chamber 1 is reduced to a predetermined pressure (e.g., $10^{-3}$ Torr). As this predetermined pressure is reached, the valve 18 is closed and the valve 20 is opened, such that helium is supplied. This helium supply continues until the inside pressure of the stage accommodating chamber 1 reaches a predetermined pressure (e.g., 100 Torr).

As the helium is supplied and the inside pressure of the stage accommodating chamber 1 reaches the predetermined pressure, the wafer hand 10 conveys a wafer 5 onto the wafer chuck 4. The conveyance of the wafer onto the wafer chuck is done with the following process.

First, the valve 13 is closed and the valve 14 is opened. In response, a predetermined vacuum attraction force is created at the wafer hand 10, and the wafer is vacuum attracted to the wafer hand 10. Here, the wafer hand 10 holds the wafer 5 vertically (upstanding position). The wafer 5 is moved and conveyed by the wafer hand 10, while being vacuum attracted thereby, through the stage accommodating chamber 1 and to the position of the wafer chuck 4. As the wafer 5 reaches the position above the wafer chuck 4, the wafer hand 10 moves in the positive (+) Z direction so that the wafer 5 comes close to the wafer chuck 4.

As the spacing between the wafer 5 and the wafer chuck 4 becomes equal to a predetermined distance, the valve 13 is opened by which a predetermined vacuum attraction force is created at the wafer chuck 4o The wafer 5 is further moved closer to the wafer chuck 4 and, as they come substantially into contact with each other, the valve 14 is closed by which the vacuum attraction by the wafer hand 10 is discontinued. In response, the wafer 5 is attracted to the wafer chuck 4, such that the transfer of the wafer is completed. The wafer 5 can be transferred from the wafer chuck 4 to the wafer hand 10 with a reverse operation to the described.

The vacuum attraction at the wafer chuck 4 and at the wafer hand 10 is provided by both the primary pump 15 and the secondary (backup) pump 58. The vacuum evacuation capacities of these pumps are set as follows.

When the wafer hand 10 or the wafer chuck 4 vacuum attracts a wafer 5, the vacuum evacuation capacity thereof is determined by, for example, the size of the wafer, the friction coefficient of the attraction surface, resistances of the restriction valves 54 and 55, and the spacing between the wafer chuck 4 and the wafer hand 10 at the time of wafer transfer therebetween.

If the wafer hand 10 or the wafer chuck 4 should merely vacuum attract a wafer 5, it would be sufficient that the vacuum evacuation capacity thereof be capable of providing at the wafer hand 10 or the wafer chuck 4 a pressure lower than the inside pressure of the stage accommodating chamber 1 by about 20 Torr (2666 Pa).

However, for transfer of a wafer 5 from the wafer hand 10 to the wafer chuck 4, it is necessary that the wafer be correctly transferred without causing a drop or positional deviation of the wafer. To this end, a larger vacuum evacuation capacity is required for the pump, than that required for mere vacuum attraction.

Additionally, during the wafer transfer operation it is practically difficult to maintain the wafer 5 surface and the wafer chuck 4 surface exactly parallel to each other, and a substantial distance has to be kept between the wafer 5 and the wafer chuck 4 in the wafer transfer operation. Thus, the vacuum evacuation capacity should be set while taking into account this distance. Moreover, the pipings 11 and 12 are provided with the restriction valves 54 and 55, and it is necessary to set the vacuum evacuation capacity while also taking into account the resistance of these restriction valves.

In this embodiment, therefore, it is necessary that, for the wafer transfer operation, the vacuum evacuation capacity of the pump should be capable of providing vacuum attraction at the wafer hand 10 or the wafer chuck 4 with a pressure lower than the inside pressure of the stage accommodating chamber 1 by about 100 Torr (13330 Pa).

In consideration of the above, a combined vacuum evacuation capacity of the primary pump 15 and the secondary pump 58 used in this embodiment is preferably set to produce, at the wafer hand 10 or the wafer chuck 4, a pressure lower than the inside pressure of the stage accommodating chamber 1 by about 100 Torr (13330 Pa).

Upon power failure, only the backup pump 58 operates and the transfer operation for the wafer 5 is not performed. Thus, it is sufficient that the backup pump 58 has a vacuum evacuation capacity necessary for simply attracting and holding the wafer 5. Therefore, the vacuum evacuation capacity of the backup pump is set to produce, at the wafer hand 10 or the wafer chuck 4, a pressure lower than the inside pressure of the stage accommodating chamber 1 by about 20 Torr (2666 Pa), as described hereinbefore.

In the wafer transfer operation, it is possible that both of the valves 13 and 14 are open simultaneously. In that occasion, one of the vacuum systems is in an "idle" state. However, the restriction valves 54 and 55 serve to reduce the flow of gas from the stage accommodating chamber 1 into that vacuum system being in the "idle" state and, as a result, the pressure in that vacuum system does not change rapidly. Namely, in this embodiment, even if both of the valves 13 and 14 are opened and one of the vacuum systems comes into an "idle" state, the pressure change due to the "idling" of the one vacuum system is suppressed within a predetermined range. Thus, it does not affect the vacuum attraction force of the other vacuum system.

Next, the operation of the holding system described above upon a power failure will be explained in more detail.

In the holding system described above, occurrence of a power failure is detected by the voltage detecting circuit 36. In response to the detection, the voltage detecting circuit 36 controls the switch 37 so as to change, instantly, the power supply line to the backup pump 58, from the normal power source 16 to the emergency power source 17. Thus, the power supply to the backup pump 58 is not interrupted by the power failure, but the power is continuously supplied from the emergency power source 17.

FIG. 2 is a sequence chart, for explaining the operational sequence of the holding system of this embodiment, upon a power failure. The operation in the power failure will be explained in more detail, in conjunction with the drawing of FIG. 2.

It is now assumed that the wafer hand 10 is conveying a wafer 5. As illustrated in FIG. 2, the output of the normal power source 16 is in order, and the voltage detecting circuit 36 detects the normal state. Also, the primary pump 15 and the secondary (backup) pump 58 are operating in order. At this time, the valve 13 is closed and the valve 14 is open.

As the transfer operation for transferring the wafer 5 from the wafer hand 10 to the wafer chuck 4 starts, the valve 13 is opened. Then, the valve 14 is closed, and the wafer 5 transfer operation is completed.

Here, if a power failure occurs, the normal power source 16 is shut down and the primary pump stops. This abnormal state is detected by the voltage detecting circuit 36, and the voltage detecting circuit 36 operates to change the power supply line to the backup pump 58 from the normal power source 16 to the emergency power source 17. Thus, the backup pump does not stop and operates continuously.

In this state, the valve 13 is open and the valve 14 is closed. Thus, the backup pump 58 performs the vacuum attraction at the wafer chuck 4, through the valve 13. As a result, the wafer chuck 4 keeps the vacuum attraction force necessary for attracting the wafer 5 against the inside pressure of the stage accommodating chamber 1. Thus, even during the power failure, the wafer 5 is kept fixed to the wafer chuck 4. In the state described, the operation of the apparatus is stopped, and this state is maintained until the power is restored.

As the power is recovered, the normal power source 16 is turned normal and the primary pump 15 becomes operable. Simultaneously, the voltage detecting circuit 36 detects the normal state, and it changes the power supply line to the backup pump 58, from the emergency power source 17 to the normal power source As the operation of the primary pump 15 and the backup pump 58 restarts with the above-described procedure, the maintained state of the valves 13 and 14 is canceled and the abnormality restoring operation including the wafer 5 collecting operation is performed.

Although the foregoing description has been made with respect to an example of a power failure occurring in the state in which a wafer 5 is vacuum attracted to the wafer chuck 4, a similar process will be made in relation to a case where the wafer is vacuum attracted to the wafer hand 10.

In that case, the wafer 5 is kept in a state being vacuum attracted to the wafer hand 10, and in the holding system, the motion of the wafer hand 10 stops. This state is kept until the power is restored. After the power is recovered, the abnormality restoring operation is made in the holding system.

If a power failure occurs in the transfer operation for transferring a wafer 5 from the wafer hand 10 to the wafer chuck 4, namely, in the state in which both of the valves 13 and 14 are open and thus one of the vacuum systems is "idle", the pressure change in the pipings 11 and 12 is suppressed within a predetermined range by means of the restriction valves 54 and 55. As a result, the wafer 5 is held in a state in which it is vacuum attracted to one of the wafer chuck 4 and the wafer hand 10.

In the holding system described hereinbefore, the vacuum evacuation capacity of the backup pump is set smaller than that of the primary pump. The minimum of the vacuum evacuation capacity to be set may correspond to the capacity for producing the least vacuum attraction force, at the wafer chuck or wafer hand, necessary for attracting and holding a wafer without causing a drop or deviation of the wafer. Therefore, when such a pump as having a maximum vacuum evacuation capacity equivalent to the "minimum capacity" just mentioned above is used, the power consumption during the power failure can be reduced effectively. Also, the size of the backup voltage source can be reduced.

While the foregoing description has been made of an embodiment of a holding system used in an X-ray exposure apparatus, the present invention is applicable also to a holding system in any type of exposure apparatus having a vacuum attraction means, for example, an optical exposure apparatus or an electron beam exposure apparatus. Also, the invention is applicable to any other apparatus, other than the exposure apparatus, having a holding system for holding an article through vacuum attraction.

While the invention has been described with reference to the structures disclosed herein, it is not confined to the details set forth and this application is intended to cover such modifications or changes as may come within the purposes of the improvements or the scope of the following claims.

What is claimed is:

1. A substrate holding system, comprising:

a holding mechanism for holding a substrate through vacuum attraction;

vacuum evacuating means for supplying a vacuum to said holding mechanism;

a first voltage source for supplying electric power to said vacuum evacuating means;

a second voltage source, separate from said first voltage source, for supplying electric power to said vacuum evacuating means; and a controller for energizing said vacuum evacuating means at a higher evacuation capacity level, when said first voltage source is in operable order, and for energizing said vacuum evacuating means at a lower evacuation capacity level, when said second voltage source supplies electric power to said vacuum evacuating means, and said first voltage source is not in operable order.

2. A system according to claim 1, wherein said second voltage source serves as a backup voltage source.

3. A system according to claim 1, wherein the substrate is a wafer to be exposed with radiation.

4. A system according to claim 1, further comprising means for applying a radiation energy to the substrate.

5. A system according to claim 1, further comprising a chamber for placing said holding mechanism in a pressure ambience lower than an atmospheric pressure.

6. A system according to claim 5, further comprising second evacuating means for evacuating said chamber.

7. A system according to claim 1, further comprising at least one of a chuck for fixedly supporting the substrate and a hand mechanism for holding and conveying the substrate, wherein said holding mechanism is mounted on the one of said chuck and said hand mechanism.

8. A system according to claim 1, wherein the substrate is held vertically.

9. A system according to claim 1, wherein said controller comprises means for monitoring electric voltage supplied to said vacuum evacuating means.

10. A system according to claim 9, wherein said controller discriminates the operable order of the first voltage source on the basis of the monitored electric voltage.

11. A system according to claim 1, wherein said controller energizes said vacuum evacuating means with said second voltage source in response to a power failure in relation to said first voltage source.

12. A system according to claim 2, wherein said backup voltage source comprises an urgency power supply source.

13. A system according to claim 1, wherein said vacuum evacuating means comprises first and second pumps.

14. A system according to claim 13, wherein said controller energize said first and second pumps with said first voltage source when said first voltage source is in operable order, and energizes only said second pump with said second voltage source when said first voltage source is not in operable order.

15. A system according to claim 13, wherein said second pump has an evacuation capacity lower than that of said first pump, but sufficient for holding the substrate.

* * * * *

UNITED STATES PATENT AND TRADEMARK OFFICE
CERTIFICATE OF CORRECTION

PATENT NO. : 5,586,159        Page 1 of 2
DATED : December 17, 1996
INVENTOR(S) : Atsushi KITAOKA, et al.

It is certified that error appears in the above-indentified patent and that said Letters Patent is hereby corrected as shown below:

ON THE COVER PAGE

Under item [56], "FOREIGN PATENT DOCUMENTS:

"4176533   6/1992   Japan ..............269/21" should read
--4-176533  6/1992   Japan .............269/21--.

IN THE DISCLOSURE

COLUMN 1:

Line 9, "use" should read --use in--.

COLUMN 2:

Line 65, "it" should read --them--.

COLUMN 4:

Line 27, "by" should read --by a--.

COLUMN 5:

Line 53, "4o" should read --4.--.

UNITED STATES PATENT AND TRADEMARK OFFICE
CERTIFICATE OF CORRECTION

PATENT NO. : 5,586,159
DATED : December 17, 1996
INVENTOR(S) : Atsushi KITAOKA, et al.

It is certified that error appears in the above-indentified patent and that said Letters Patent is hereby corrected as shown below:

COLUMN 7:

Line 45, "source" should read --source 16.--.

COLUMN 8:

Line 52, "a" should be deleted.

COLUMN 10:

Line 2, "energize" should read --energizes--.

Signed and Sealed this

Twenty-eighth Day of October, 1997

Attest:

BRUCE LEHMAN

*Attesting Officer*     *Commissioner of Patents and Trademarks*